(12) United States Patent
Ellis-Monaghan et al.

(10) Patent No.: US 9,304,335 B2
(45) Date of Patent: Apr. 5, 2016

(54) INTEGRATED LDMOS DEVICES FOR SILICON PHOTONICS

(71) Applicant: INTERNATIONAL BUSINESS MACHINES CORPORATION, Armonk, NY (US)

(72) Inventors: John J. Ellis-Monaghan, Grand Isle, VT (US); William M. Green, Astoria, NY (US); Michael J. Hauser, Bolton, VT (US); Edward W. Kiewra, South Burlington, VT (US); Xuefeng Liu, Roseville, CA (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/332,886

(22) Filed: Jul. 16, 2014

(65) Prior Publication Data

US 2016/0018677 A1    Jan. 21, 2016

(51) Int. Cl.
| | |
|---|---|
| *H01L 21/782* | (2006.01) |
| *H01L 27/14* | (2006.01) |
| *H01L 29/78* | (2006.01) |
| *G02F 1/025* | (2006.01) |
| *H01L 29/10* | (2006.01) |
| *H01L 29/08* | (2006.01) |
| *H01L 29/423* | (2006.01) |
| *H01L 29/40* | (2006.01) |
| *H01L 29/06* | (2006.01) |

(Continued)

(52) U.S. Cl.
CPC .............. *G02F 1/025* (2013.01); *G02B 6/136* (2013.01); *H01L 21/30604* (2013.01); *H01L 27/0617* (2013.01); *H01L 27/088* (2013.01); *H01L 29/0634* (2013.01); *H01L 29/0653* (2013.01); *H01L 29/0865* (2013.01); *H01L 29/0882* (2013.01); *H01L 29/1095* (2013.01); *H01L 29/402* (2013.01); *H01L 29/42356* (2013.01); *H01L 29/4916* (2013.01); *H01L 29/66681* (2013.01); *H01L 29/7823* (2013.01); *G02B 2006/12061* (2013.01); *G02B 2006/12142* (2013.01); *G02B 2006/12176* (2013.01)

(58) Field of Classification Search
CPC ...................... H01L 21/8258; H01L 27/0605
USPC .......... 257/290, 528, 499, E21.603, E27.012, 257/E27.12; 438/31
See application file for complete search history.

(56) References Cited

U.S. PATENT DOCUMENTS

| | | | |
|---|---|---|---|
| 5,536,954 | A | 7/1996 | Rosen et al. |
| 6,278,170 | B1 | 8/2001 | Komatsu |

(Continued)

OTHER PUBLICATIONS

Beals et al., "Process Flow Innovations for Photonic Device Integration in CMOS", Silicon Photonics III, Proceedings of Spie Digital Library, vol. 6898, 2008; 14 Pages.

(Continued)

*Primary Examiner* — Kimberly Rizkallah
*Assistant Examiner* — Brian Turner
(74) *Attorney, Agent, or Firm* — Michael Le Strange; Andrew M. Calderon; Roberts Mlotkowski Safran & Cole, P.C.

(57) ABSTRACT

A device includes a laterally diffused metal-oxide-semiconductor (LDMOS) device integrated with an optical modulator. An optical waveguide of the optical modulator includes a silicon-containing structure in a drift region of the LDMOS device.

16 Claims, 7 Drawing Sheets

(51) Int. Cl.
*H01L 29/49* (2006.01)
*H01L 27/088* (2006.01)
*H01L 21/306* (2006.01)
*H01L 29/66* (2006.01)
*H01L 27/06* (2006.01)
*G02B 6/136* (2006.01)
*G02B 6/12* (2006.01)

(56) References Cited

U.S. PATENT DOCUMENTS

| | | | |
|---|---|---|---|
| 6,323,985 B1 | 11/2001 | Maloney | |
| 6,870,977 B2 | 3/2005 | Devaux et al. | |
| 7,526,170 B2 | 4/2009 | Kishima | |
| 7,711,212 B2 | 5/2010 | Green et al. | |
| 7,720,320 B2 | 5/2010 | Shih et al. | |
| 7,876,799 B2 | 1/2011 | Yamatoya et al. | |
| 8,211,730 B1 | 7/2012 | Thai et al. | |
| 8,242,564 B2 | 8/2012 | Spencer et al. | |
| 8,401,344 B2 | 3/2013 | Ishibashi et al. | |
| 8,406,634 B2 | 3/2013 | Xu et al. | |
| 8,598,660 B2 | 12/2013 | Camillo-Castillo et al. | |
| 2003/0015767 A1* | 1/2003 | Emrick et al. | 257/528 |
| 2005/0018941 A1* | 1/2005 | Coldren et al. | 385/1 |
| 2010/0142567 A1* | 6/2010 | Ward et al. | 372/20 |
| 2011/0073989 A1 | 3/2011 | Rong et al. | |
| 2011/0194803 A1 | 8/2011 | Shin et al. | |
| 2012/0126323 A1* | 5/2012 | Wu et al. | 257/343 |
| 2012/0129302 A1 | 5/2012 | Assefa et al. | |
| 2013/0181233 A1 | 7/2013 | Doany et al. | |
| 2014/0050436 A1 | 2/2014 | Lee et al. | |

OTHER PUBLICATIONS

Harris et al., "Single-Chip Photonic Integration with CMOS for Aerospace", IEEE, 2012; 2 Pages.

Fulbert et al., "Photonics-Electronics Integration on CMOS", IEEE, 2011; 6 Pages.

Soref et al., "Electrooptical Effects in Silicon", IEEE Journal of Quantum Electronics, vol. QE-23, No. 1, Jan. 1987, pp. 123-129.

Green et al., "Ultra-Compact, Low RF Power, 10 Gb/s Silicon Mach-Zehnder Modulator", Optics Express, vol. 15, No. 25, Dec. 10, 2007, pp. 17106-17113.

Liao et al., "High Speen Silicon Mach-Zehnder Modulator", Optics Express, vol. 13, No. 8, Apr. 18, 2005, pp. 3129-3135.

Liu et al., "A High-Speed Silicon Optical Modulator Based on Metal-Oxide-Semiconductor Capacitor", Nature, vol. 427, Feb. 12, 2004, pp. 615-618.

* cited by examiner

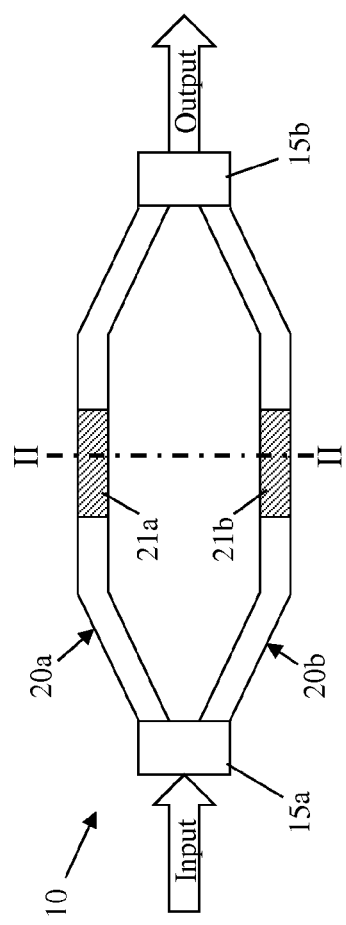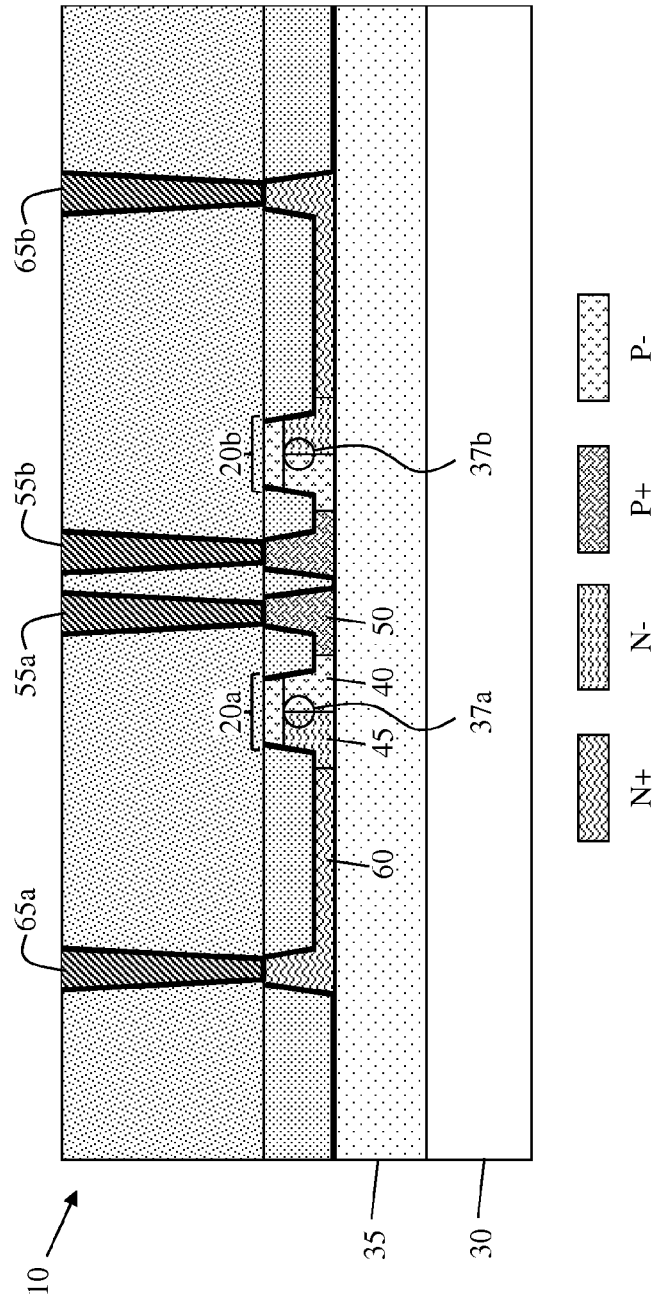

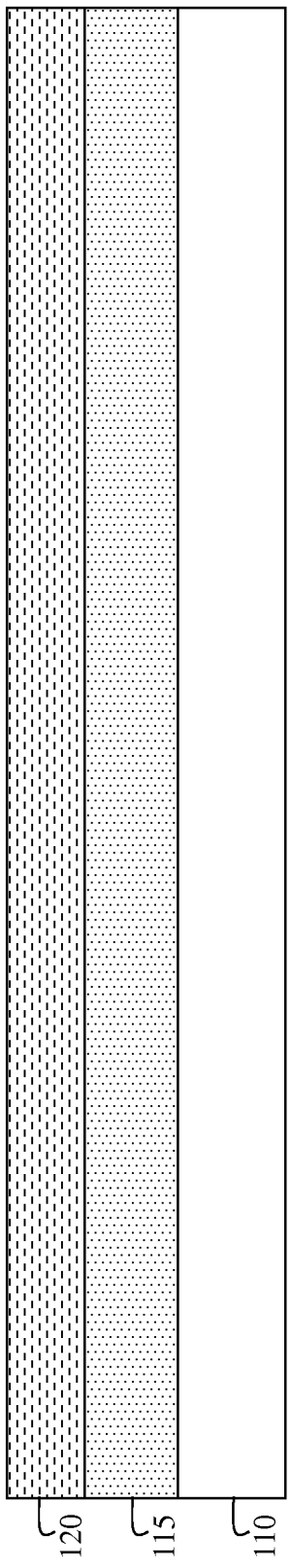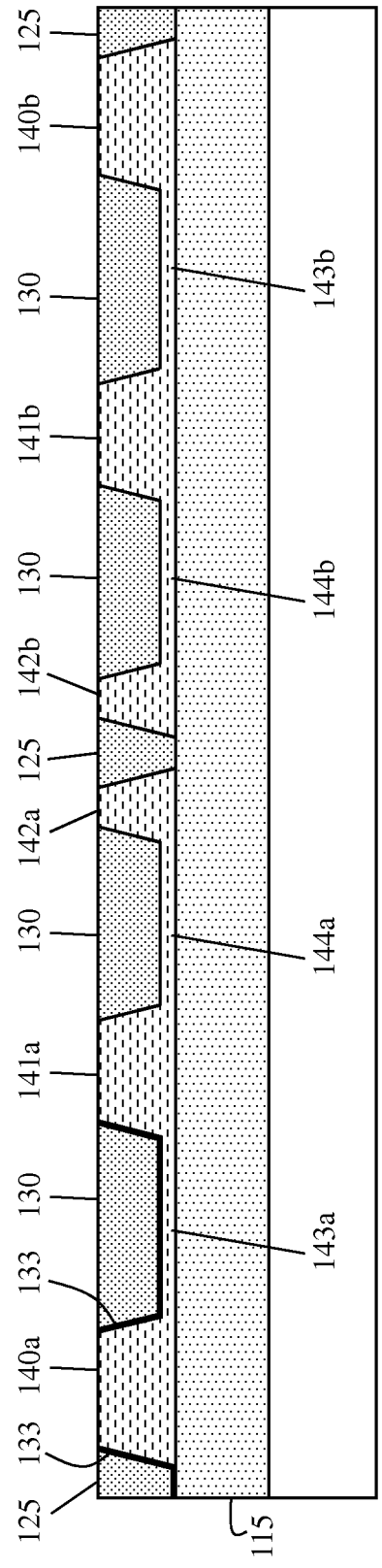

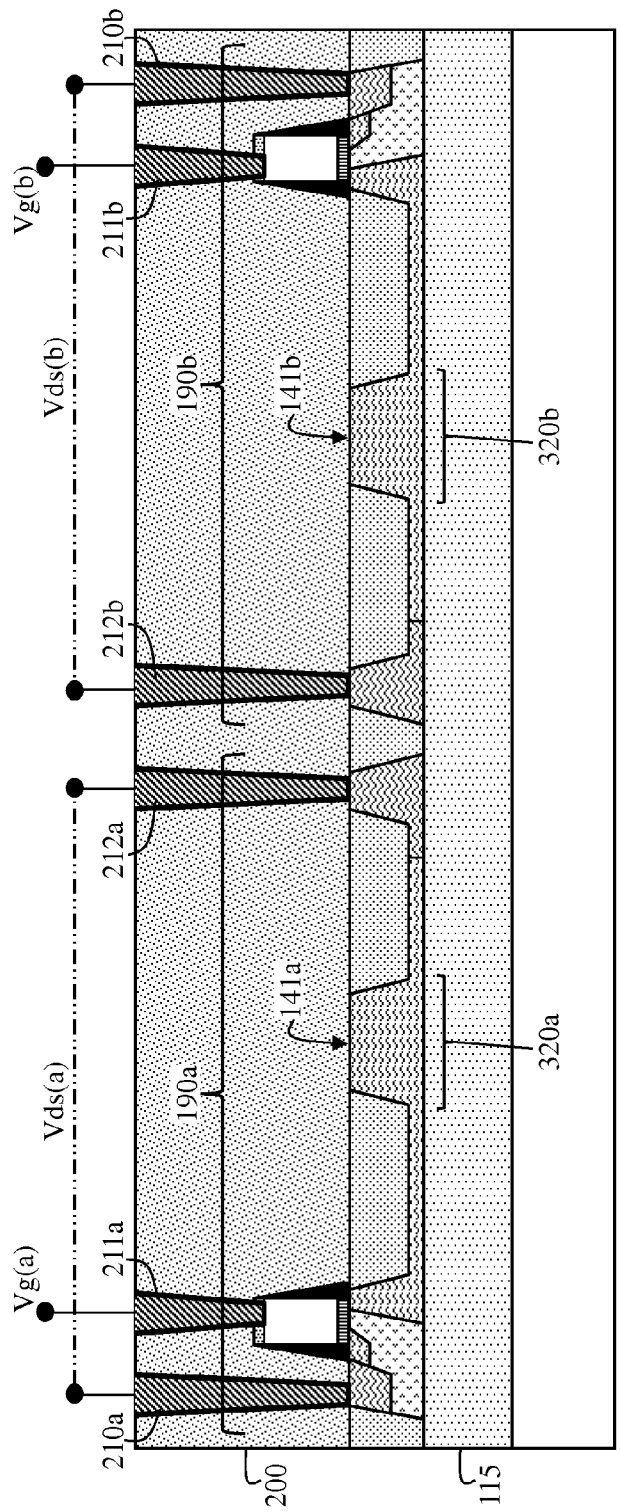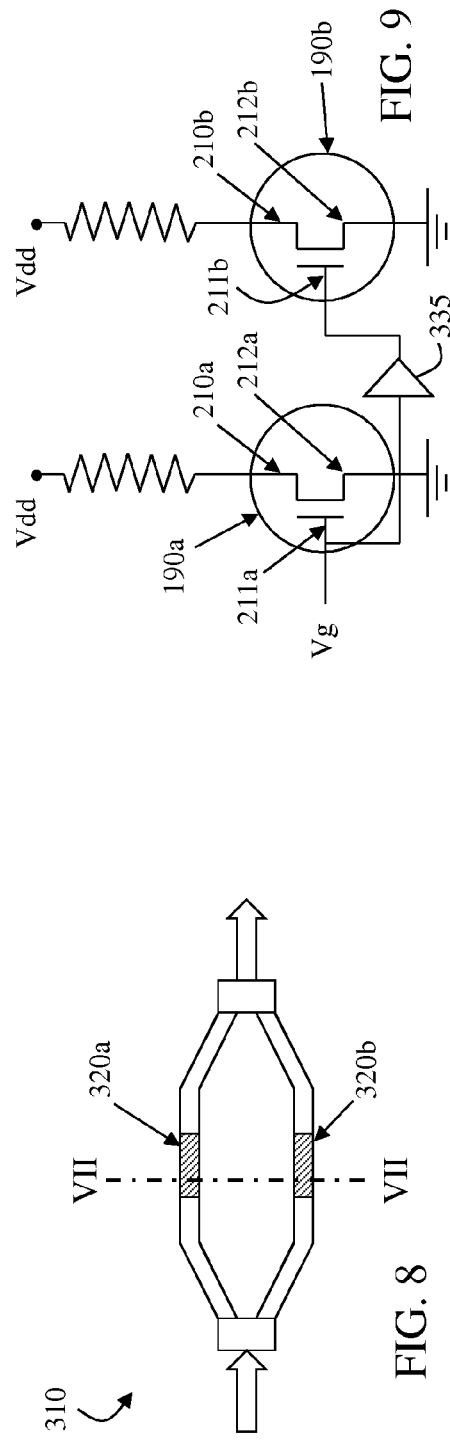
FIG. 7
FIG. 8
FIG. 9

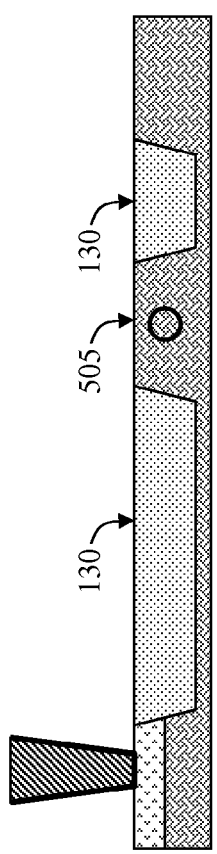
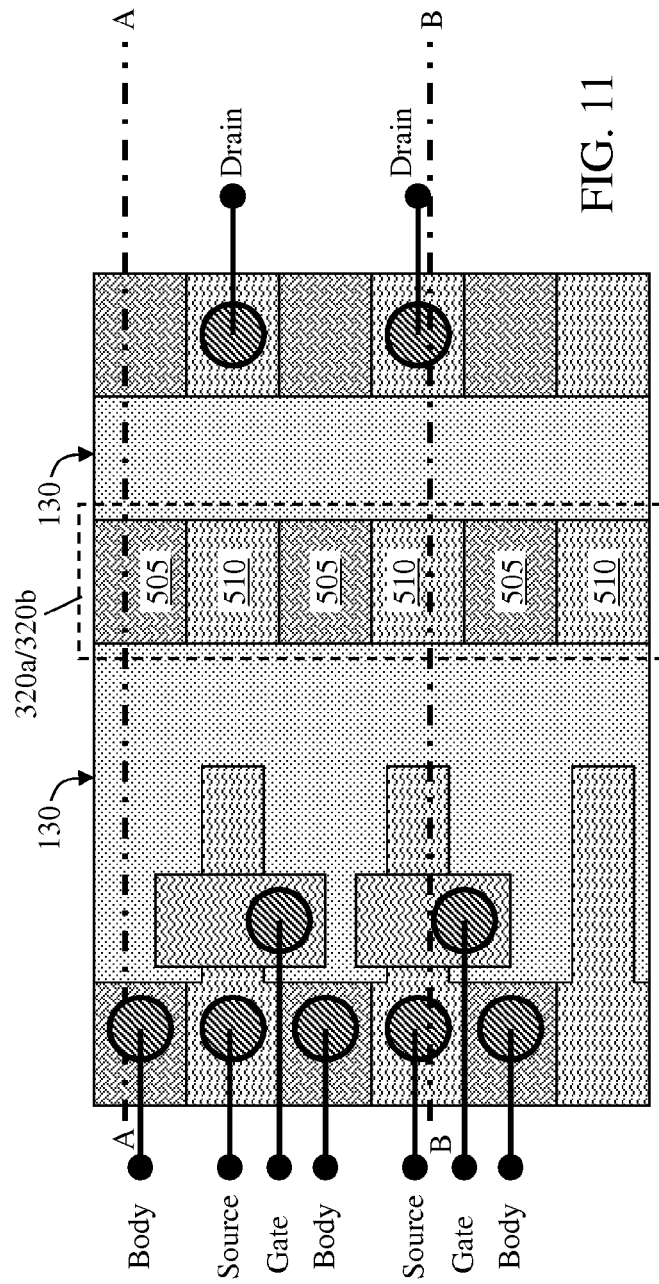
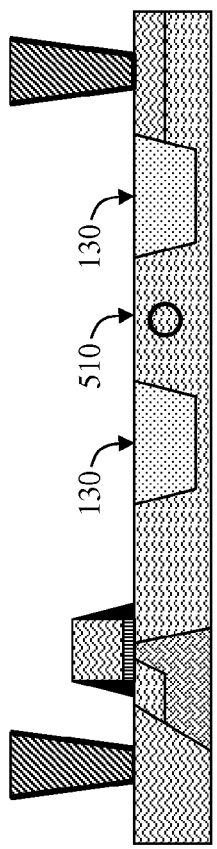
FIG. 12
FIG. 11
FIG. 13

INTEGRATED LDMOS DEVICES FOR SILICON PHOTONICS

FIELD OF THE INVENTION

The invention relates to silicon photonic devices and, more particularly, to integrating laterally diffused metal-oxide-semiconductor (LDMOS) devices with silicon photonic devices.

BACKGROUND

Silicon photonics is the study and application of photonic systems that use silicon as an optical medium. A silicon photonics optical waveguide device typically includes a substrate, a cladding layer formed on the substrate, and a waveguide—also called waveguide core—formed in the cladding layer for transmitting an optical signal. Such waveguide devices are also called integrated optical devices or opto-electronic integrated circuits. The waveguide core commonly has the shape of a silicon strip or rib.

Light signals may be introduced into and out of the waveguide core by coupling optical fibers thereto. The core serves to confine an optical light signal transmitted thereto, and the light signal is mostly contained in the core as it is transmitted therethrough due to differences in refractive index of the materials that make up the waveguide core and the cladding layer.

Silicon photonics has been introduced into complementary metal-oxide semiconductor (CMOS) technology to allow simultaneous manufacture of electronic and optical components on a single integrated chip. As such, CMOS processes, such as masking and etching, are commonly used to form the waveguide core.

An optical modulator is a type of silicon photonic device. Optical modulators based on interferometric or resonant waveguide structures modulate light by introducing a change in the effective refractive index, which provides a shift in the optical phase of a lightwave passing through the modulator. This index change is often accomplished by implementing a phase shifter diode across the waveguide and operating the diode in either the forward-biased or reverse-biased condition. In the forward-biased condition, the diode injects a comparatively large amount of current at low voltage, inducing a large index shift for a given length of waveguide.

SUMMARY

In a first aspect of the invention, there is a device comprising a laterally diffused metal-oxide-semiconductor (LDMOS) device integrated with an optical modulator. An optical waveguide of the optical modulator comprises a silicon-containing structure in a drift region of the LDMOS device.

In another aspect of the invention, there is an optical modulator integrated with high voltage LDMOS devices, comprising: a substrate; a first insulator layer on the substrate; and a silicon layer on the first insulator layer. The silicon layer is patterned into a first LDMOS and a second LDMOS that are laterally separated. The optical modulator integrated with high voltage LDMOS devices also comprises: a first optical waveguide in a center silicon mesa of the first LDMOS; a second optical waveguide in a center silicon mesa of the second LDMOS; a shallow trench isolation region (STI) electrically isolating the first LDMOS and the second LDMOS; a second insulator layer over and contacting portions of the silicon layer; a first polysilicon gate structure on an outboard mesa of the first LDMOS; and a second polysilicon gate structure on an outboard mesa of the second LDMOS. The optical modulator integrated with high voltage LDMOS devices also comprises: a first contact stud on the outboard mesa of the first LDMOS and beside the first polysilicon gate structure; a second contact stud on the outboard mesa of the second LDMOS and beside the second polysilicon gate structure; a third contact stud on an inboard mesa of the first LDMOS; a fourth contact stud on an inboard mesa of the second LDMOS; a fifth contact stud on the first polysilicon gate structure; a sixth contact stud on the second polysilicon gate structure; and a third insulator layer between and around the first, second, third, fourth, fifth, and sixth contact studs.

In another aspect of the invention, there is a method of manufacturing a device comprising: patterning a silicon-containing layer to form a first mesa, a second mesa, a third mesa, a first strip connecting the first mesa and the third mesa, and a second strip connecting the second mesa and the third mesa; forming an LDMOS device in the first mesa, the second mesa, the third mesa, the first strip, and the second strip; and forming an optical modulator comprising an optical waveguide that comprises the third mesa.

In another aspect of the invention, a design structure tangibly embodied in a machine readable storage medium for designing, manufacturing, or testing an integrated circuit is provided. The design structure comprises one or more structures of the present invention. In further embodiments, a hardware description language (HDL) design structure encoded on a machine-readable data storage medium comprises elements that when processed in a computer-aided design system generates a machine-executable representation of an LDMOS device integrated with an optical modulator which comprises one or more structures of the present invention. In still further embodiments, a method in a computer-aided design system is provided for generating a functional design model of a LDMOS device integrated with an optical modulator. The method comprises generating a functional representation of the structural elements of the LDMOS device integrated with an optical modulator.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1 and 2 show a diode-based optical modulator;

FIGS. 3-13 show views of structures and respective processing steps in accordance with aspects of the invention.

DETAILED DESCRIPTION

Figure 5:
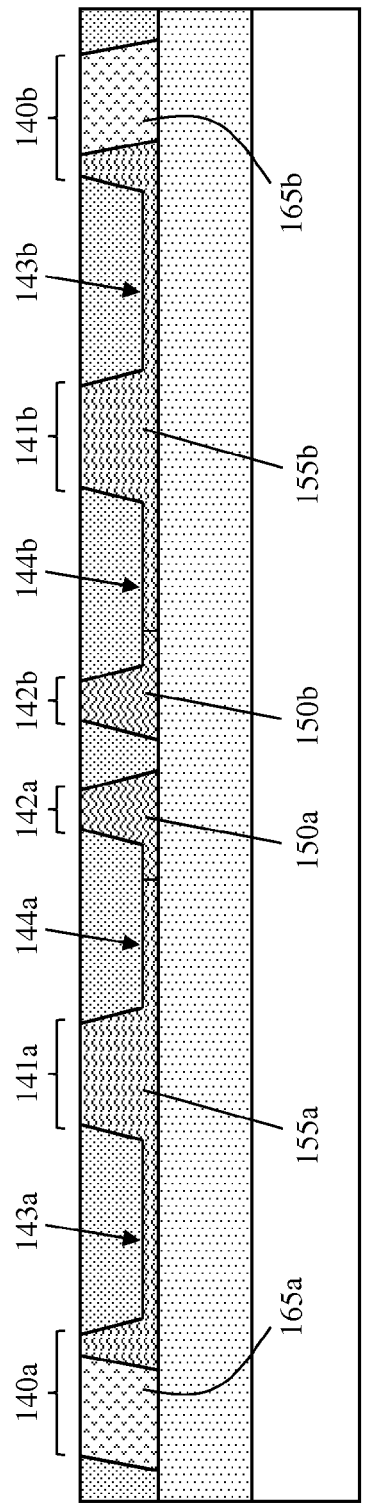

The invention relates to silicon photonic devices and, more particularly, to integrating laterally diffused metal-oxide-semiconductor (LDMOS) devices with silicon photonic devices. According to aspects of the invention, LDMOS devices are integrated with silicon photonic devices in a wafer. In embodiments, a respective LDMOS transistor is formed in each leg of an optical modulator for selectively providing a phase shift of the light signal in at least one of the legs of the modulator. The LDMOS transistors have a relatively low threshold voltage and a relatively high drain-to-source voltage. In this manner, an LDMOS-driven optical modulator in accordance with aspects of the invention provides a low power modulator device while allowing for high operating voltages.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

FIGS. 1 and 2 show a diode-based optical modulator. More specifically, FIG. 1 shows a modulator 10 including two legs 20a, 20b that extend between a first coupler 15a and a second coupler 15b. The legs 20a, 20b are optical waveguides composed of silicon and configured to transmit a light signal. Each leg 20a, 20b has a respective phase shifter section 21a, 21b as described in greater detail with respect to FIG. 2.

FIG. 2 is a cross-section view of the modulator 10 taken along line II-II of FIG. 1. As represented in FIG. 2, the modulator 10 is implemented in a silicon-on-insulator (SOI) semiconductor structure that includes a substrate 30 and a buried oxide (BOX) layer 35. The waveguides of the modulator 10, i.e., legs 20a, 20b, are formed as silicon strips (e.g., ribs, etc.) on the BOX layer 35. For example, as shown in FIG. 2, each of the legs 20a, 20b comprises a silicon strip on the BOX layer 35, wherein the silicon strip transmits and confines a light signal represented by shapes 37a, 37b.

With continued reference to FIG. 2, each of the legs 20a, 20b includes a p-n junction that can be driven to have a higher or lower density of carriers (electrons or holes) by applying a bias voltage to the material of the legs 20a, 20b. For example, leg 20a includes a p-type region 40 and an n-type region 45 that directly contact one another and form a p-n junction. The p-type region 40 contacts a p+ type region 50 that, in turn, contacts an electrical contact 55a. The n-type region 45 contacts an n+ type region 60 that, in turn, contacts an electrical contact 65a. A positive or negative voltage may be applied across the contacts 55a, 65a to make the p-n junction have a higher or lower density of carriers by changing the depletion region's size. Leg 20b has a similar p-n junction and contacts 55b, 65b.

Each leg 20a, 20b is configured to selectively apply a phase shift to its respective light signal in the following manner. The refractive index of the silicon that forms the legs 20a, 20b changes based on changing the density of carriers in the silicon region that the light passes through. Thus, the refractive index of the silicon that forms the leg 20a may be selectively changed by applying a bias voltage across the p-n junction via the contacts 55a, 65a, and the refractive index of the silicon that forms the leg 20b may be selectively changed by applying a bias voltage across the p-n junction via the contacts 55b, 65b. Changing the refractive index of the waveguide medium causes a change in the transmission speed of the light signal through the medium. By applying a positive bias to one leg (e.g., leg 20a) and a negative bias to the other leg (e.g., leg 20b), the modulator 10 can be used to cause a phase shift between the light signals in the two legs that results in destructive interference such that a constant light signal is converted to a pulsing light signal. The modulator 10 is referred to as a diode-based modulator since it utilizes diodes (e.g., p-n junctions) in the waveguides to apply a phase shift by adjusting the refractive index of the medium of the waveguides.

FIGS. 3-12 show processing steps and respective structures in accordance with aspects of the invention. In embodiments, an optical modulator is provided with LDMOS transistors rather than diodes for changing the refractive index of the medium of the waveguide. FIG. 3 shows a starting structure for making an integrated LDMOS and silicon photonic device. In particular, FIG. 3 shows an SOI wafer comprising a substrate 110, an insulator layer 115 on the substrate 110, and a semiconductor layer 120 on the insulator layer 115. The constituent materials of the photonic device may be selected based on the desired end use application of the device. For example, the substrate 110 may be composed of any suitable material including conductor materials, semiconductor material, and dielectric materials. More specifically, the substrate 110 may be composed of Si, SiGe, SiGeC, SiC, GE alloys, GaAs, InAs, InP, and other III/V or II/VI compound semiconductors.

The insulator layer 115 may be composed of a dielectric material such as, for example, $SiO_2$ or other oxides. In embodiments, the insulator layer 115 is composed of a material that has a refractive index that is less than the refractive index of the material of the semiconductor layer 120.

The semiconductor layer 120 may comprise silicon, such as single crystal silicon, polysilicon, GaAs, SiC, or other semiconductor materials in which devices can be designed. In embodiments, the semiconductor layer 120 is composed of a material that has a refractive index that is greater than the refractive index of the material of the insulator layer 115, and that is also greater than the refractive index of any cladding material later-formed on the surfaces of waveguide cores formed from the semiconductor layer 120.

The substrate 110, insulator layer 115 and semiconductor layer 120 may have any desired thickness in the vertical direction, e.g., in the direction perpendicular to the interface between the insulator layer 115 and the semiconductor layer 120. In a non-limiting example, the substrate 110 has a thickness of about 100 µm to about 800 µm, the insulator layer 115 has a thickness of about 1.0 µm to about 15 µm, and the semiconductor layer 120 has a thickness of about 0.1 µm to about 0.3 µm; although other dimensions are contemplated by aspects of the invention.

As shown in FIG. 4, isolation structures are formed in the semiconductor layer 120. A first type of isolation structure 125 extends entirely through the semiconductor layer 120 to the underlying insulator layer 115. A second type of isolation structure 130 extends only partially into the semiconductor layer 120, but not through the entire vertical depth of the semiconductor layer 120. The isolation structures 125, 130 may be formed using conventional shallow trench isolation (STI) processes and materials. For example, the isolation structures 125 may be formed by masking and etching portions of semiconductor layer 120 to form trenches, filling the trenches with STI material, e.g., oxide, nitride, etc., and optionally planarizing the structure, e.g., using chemical mechanical polish (CMP) or the like. The masking may be performed using conventional photolithography techniques, such as forming a layer of photoresist material on the semiconductor layer 120, exposing the photoresist material to a pattern of light, and developing the exposed photoresist material. The etching may comprise conventional etching techniques, such as a reactive ion etch (RIE) that is used to remove portions of the semiconductor layer 120 that are not covered by the photomask. After etching, the photomask may be removed using a conventional ashing or stripping process.

The isolation structures 130 may be formed using similar processes and materials as isolation structures 125, but using a timed etch such that the trenches formed in the semiconductor layer 120 do not extend completely through the semiconductor layer 120. In embodiments, the isolation structures 130 extend through about 70% to 90% of the depth of the semiconductor layer 120 for reasons described in greater detail herein. The isolation structures 125, 130 may be formed in separate processing steps, e.g., forming isolation structures 125 in a first STI process and then forming isolation structures 130 in a second STI process. As shown in FIG. 4, an optional STI liner 133 may also be formed with any one or more of the isolation structures 125, 130 using conventional STI processes and materials (e.g., nitride, oxide, etc.).

Still referring to FIG. 4, in accordance with aspects of the invention, the isolation structures 125, 130 are formed with sizes and shapes that result in the formation of a first set of mesas 140a, 141a, 142a of the material of the semiconductor layer 120, and a second set of mesas 140b, 141b, 142b of the material of the semiconductor layer 120. The mesas 140a-b, 141a-b, 142a-b extend lengthwise in a direction orthogonal to the plane of view of FIG. 4, and thus constitute strips (e.g., ribs) of silicon-containing material that may be used in a silicon photonic device. Due to the isolation structures 130 extending only partially into the semiconductor layer 120, the mesas 140a and 141a are connected by a continuous strip 143a of material of the semiconductor layer 120, and the mesas 141a and 142a are connected by a continuous strip 144a of material of the semiconductor layer 120. Similarly, the mesas 140b and 141b are connected by a continuous strip 143b of material of the semiconductor layer 120, and the mesas 141b and 142b are connected by a continuous strip 144b of material of the semiconductor layer 120.

In embodiments, the strips 143a, 144a have a height that is about 10% to 30% of the height of the mesas 140a, 141a, 142a, e.g., due to the depth of the isolation structures 130. The height of the strips 143a, 144a is configured in this manner to be sufficiently tall to provide an electrical pathway between the mesas 140a, 141a, 142a, but short enough relative to the center mesa 141a to inhibit light signal leakage out of the center mesa 141a, which functions as an optical waveguide as described in greater detail herein. The strips 143b, 144b are similarly sized relative to the mesas 140b, 141b, 142b.

As shown in FIG. 5, regions of the mesas 140a-b, 141a-b, 142a-b and strips 143a-b, 144a-b are doped with impurities. In embodiments, a heavily doped drain region 150a is formed in the mesa 142a by implanting an n-type impurity such as phosphorous, arsenic, antimony, bismuth, etc. A lightly doped drift region 155a is formed in the mesa 141a, a portion of the mesa 140a, and the strips 143a, 144a by implanting an n-type impurity. A lightly doped well region 165a is formed in the mesa 140a by implanting a p-type impurity such as such as boron, indium, gallium, etc. As used herein, a heavily doped region has a concentration that is about 100 to 1000 times the concentration of a lightly doped region. For example, the lightly doped drift region 155a may have a concentration on the order of about $1 \times 10^{15}/cm^3$ to $1 \times 10^{17}/cm^3$ and the heavily doped drain region 150a may have a concentration on the order of about $1 \times 10^{17}/cm^3$ to $1 \times 10^{20}/cm^3$ although the invention is not limited to these values and any suitable concentrations may be used.

The doping of the regions 150a, 155a, 165a may be performed using conventional semiconductor manufacturing processes, such as conventional ion-implantation processes using a photomask having patterned openings through which ions are implanted at a desired energy and concentration. Certain ones of the ion-implantation steps may be followed by a rapid thermal anneal (RTA) or laser annealing (LSA) process to drive in the implanted dopants. Corresponding regions 150b, 155b, 165b may be formed in a similar manner in the mesas 140b, 141b, 142b and strips 143b, 144b. Any desired number of masking and ion implantation steps may be used to form the regions 150a-b, 155a-b, 165a-b shown in FIG. 5.

Figure 6:
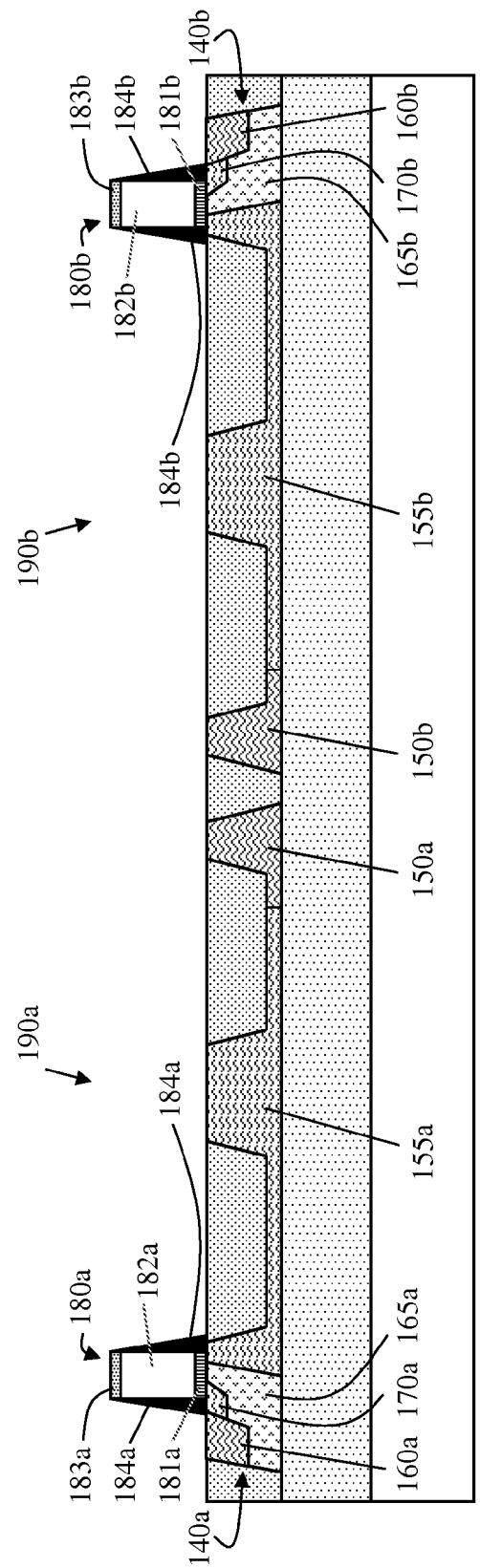

As shown in FIG. 6, respective gates 180a, 180b are formed over portions of the mesas 140a, 140b. Gate 180a may include a gate dielectric 181a, a gate conductor 182a, a gate cap 183a, and sidewall spacers 184a. The gate 180a may be formed using conventional semiconductor fabrication processes and materials. For example, the gate dielectric 181a may be any suitable gate dielectric material (e.g., $SiO_2$, hafnium oxide, etc.) grown or deposited, for example, using chemical vapor deposition (CVD) or the like. Gate conductor 182a may comprise electrically conductive materials such as, for example, metal, doped polysilicon, etc., formed using CVD. Gate cap 183a may comprise a dielectric material such as oxide or nitride. Gate dielectric 181a, gate conductor 182a, and gate cap 183a may be patterned to a desired shape after deposition, e.g., using photolithographic masking and etching. Sidewall spacers 184a may comprise, for example, silicon oxide, silicon nitride, silicon oxynitride, or the like, and may be formed, for example, by deposition of a conformal dielectric material layer and an anisotropic etch that removes horizontal portions of the conformal dielectric material layer. Gate 180b may be formed in a similar manner as gate 180a to include: gate dielectric 181b, gate conductor 182b, gate cap 183b, and sidewall spacers 184b. In embodiments, after forming the gates, a heavily doped source region 160a and a lightly doped (LDD) region 170a are formed at the top of the mesa 140a by implanting an n-type impurity using suitable masking and doping processes. A corresponding heavily doped source region 160b and lightly doped (LDD) region 170b are formed at the top of the mesa 140b.

With continued reference to FIG. 6, the gate 180a is over and contacting portions of each of the drift region 155a, the well region 165a, and the lightly doped region 170a. In this manner, the gate 180a and the regions 150a, 155a, 160a, 165a, 170a constitute a first LDMOS transistor 190a. Similarly, the gate 180b and the regions 150b, 155b, 160b, 165b, 170b constitute a second LDMOS transistor 190b.

As shown in FIG. 7, a dielectric layer 200 is formed on the exposed upper surfaces of the structure, and electrical contacts are formed in the dielectric layer 200. The dielectric layer 200 may comprise any suitable interlevel dielectric material, such as borophosphosilicate glass (BPSG), etc., and may be formed using conventional processes, such as CVD. The electrical contacts may include a source contact 210a, a gate contact 211a, and a drain contact 212a, and may be formed using conventional processes and materials. For example, the contacts may be formed by etching a trench in the dielectric layer 200, forming a barrier liner material (e.g., tantalum nitride, titanium nitride, etc.) on surfaces of the trench, and filling the reminder of the trench with an electrical conductor such as tungsten. Contacts 210b, 211b, 212b may be formed in a similar manner.

Referring now to FIGS. 7 and 8, in embodiments the mesa 141a of the first LDMOS transistor 190a shown in FIG. 7 forms an optical waveguide in a first leg 320a of an optical modulator 310 as shown in FIG. 8, and the mesa 141b of the second LDMOS transistor 190b shown in FIG. 7 forms an optical waveguide in a second leg 320b of the modulator 310 shown in FIG. 8. In this manner, FIG. 7 may represent a cross section taken along line VII-VII of FIG. 8, with the mesas 141a, 141b corresponding to cross sections of portions of the legs 320a, 320b respectively. In this manner, the LDMOS transistors 190a, 190b are integrated in the optical modulator 310 (i.e., in a silicon photonic device).

With continued reference to FIGS. 7 and 8, the optical modulator 310 may be controlled using the LDMOS transistors 190a, 190b to modulate the light signal that is being transmitted. As but one example, the optical modulator 310 may be controlled to convert a constant light signal to a pulsing light signal by selectively applying voltages to the electrical contacts 210a-b, 211a-b, 212a-b to induce a phase shift in the light signal in one or both legs 320a, 320b. In aspects of the invention, a voltage Vds(a) is applied across source contact 210a and drain contact 212a, and a voltage Vds(b) is applied across source contact 210b and drain contact 212b. A control voltage Vg(a) is applied to gate contact 211a and a control voltage Vg(b) is applied to gate contact 211b. In embodiments, Vds(a) has a constant magnitude of about 10 to 60 V, and the control voltage Vg(a) is selectively set within a range of 0 V to turn off the LDMOS transistor 190a and 1-3 V to turn on the LDMOS transistor 190a, although other voltages may be used.

Turning on the LDMOS transistor 190a using the control voltage Vg(a) causes the Vds(a) voltage to alter electrical conductivity of the material of the drift region 155a including the mesa 141a, which alters the refractive index of the material of the mesa 141a. The LDMOS transistor 190b may be controlled using similar voltages as those described with respect to the LDMOS transistor 190a. By controlling the timing of Vg(a) and Vg(b) relative to one another, i.e., to turn on LDMOS transistors 190a, 190b at different times, a phase shift can be applied to the light signals in the legs 320a, 320b that causes pattern of destructive interference. The control voltages Vg(a) and Vg(b) may be controlled independently of one another. Alternatively, the control voltages Vg(a) and Vg(b) may be controlled together using a common control signal as described with respect to FIG. 9. Additionally, the two voltages Vg(a) and Vg(b) may be controlled together by using two outputs of a differential amplifier.

FIG. 9 shows a schematic circuit diagram of one exemplary implementation of the LDMOS transistors 190a, 190b in the optical modulator 310 in accordance with aspects of the invention. As shown in FIG. 9, each of the source contacts 210a, 210b is connected to Vdd and each of the drain contacts 212a, 212b is connected to ground (e.g., Vds(a) and Vds(b) both equal Vdd, e.g., about 60 V). A control voltage Vg is applied to the gate contact 211a, and an inverter 335 applies the inverse of the control voltage Vg to the gate contact 211b (e.g., Vg(b)=the inverse of Vg(a)). The control voltage Vg is a digital voltage that is driven between, for example, 0 V and 1.2 V with a predefined frequency. In this manner, the first LDMOS transistor 190a is on while the second LDMOS transistor 190b is off, and then the first LDMOS transistor 190a is off while the second LDMOS transistor 190b is on. When either of the LDMOS devices is off, the drift region in that LDMOS depletes which changes the refractive index and provides a phase shift through that leg of the modulator. When either of the LDMOS devices is on, the drift region in that LDMOS accumulates which increases the density of carriers in the optical path, thus changing the refractive index and providing a different phase shift though that leg of the modulator.

Figure 10:
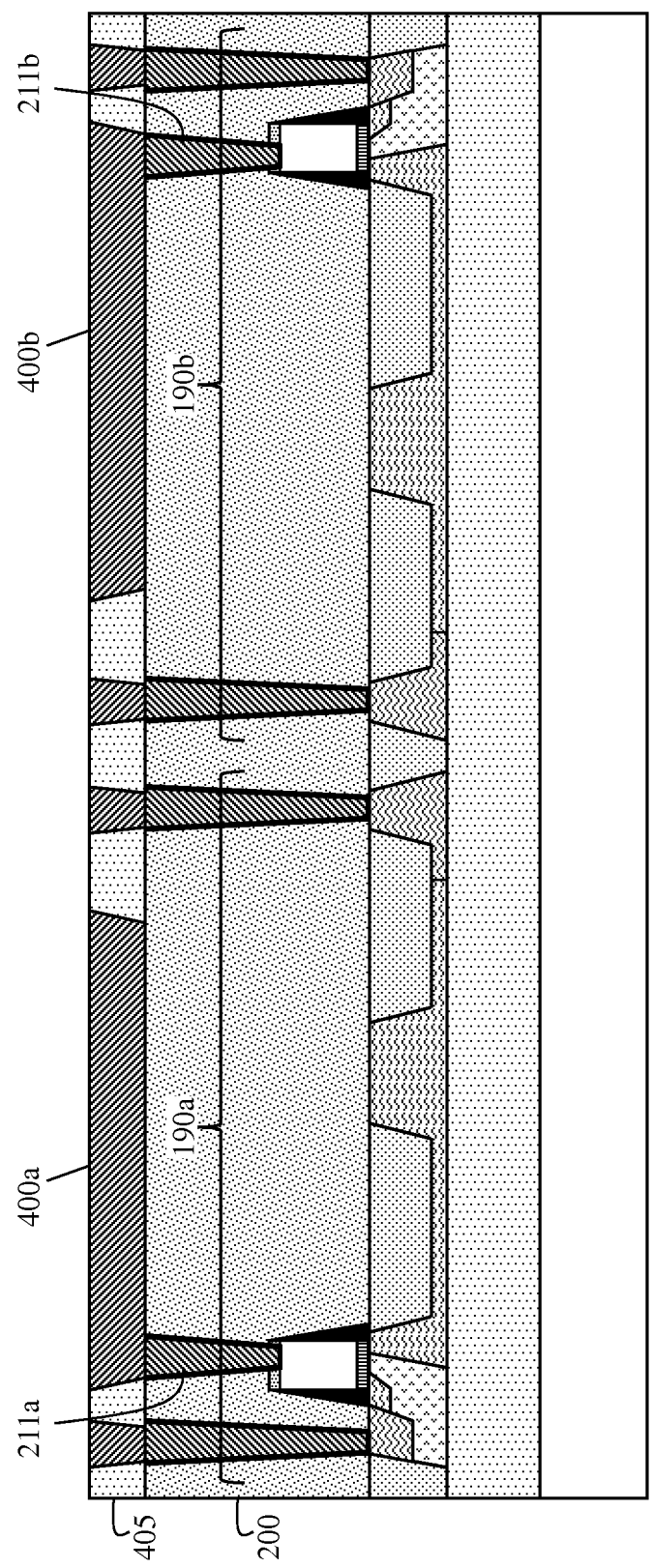

FIG. 10 shows a respective field plate 400a, 400b formed over each of the LDMOS transistors 190a, 190b in accordance with aspects of the invention. In embodiments, a dielectric layer 405 is formed on and over the dielectric layer 200 and the contacts. The field plate 400a may contact one or more of the electrical contacts, such as contact 211a. Similarly, the field plate 400b may contact one or more of the electrical contacts, such as contact 211b. The dielectric layer 405 may comprise any suitable dielectric material, such as BPSG, $SiO_2$, etc. The field plates 400a, 400b are then formed in the dielectric layer 405 using masking, etching, deposition, and planarization processes. The field plates 400a, 400b may comprise any suitable material, such as aluminum, copper, polysilicon etc. Alternately the field plate may be connected to the source instead of the gate as dictated by application conditions (e.g., transmission line impedance tuning, etc.).

FIG. 11 shows a top down (plan) view of a portion of a super-junction LDMOS modulator in accordance with aspects of the invention. FIG. 12 shows a cross section taken along line A-A of FIG. 11, and FIG. 13 shows a cross section taken along line B-B of FIG. 11. As depicted in FIGS. 11-13, a waveguide (e.g., leg 320a and/or leg 320b of modulator 310) may comprise alternating n-type and p-type regions along its length. For example, FIG. 12 shows a p-type 505 region along line A-A of FIG. 11, and FIG. 13 shows an n-type region 510 along line B-B of FIG. 11. The n-type region 510 may be part of an LDMOS transistor, as depicted in FIG. 13 and as described with respect to FIGS. 6-7. The super-junction implementation of FIGS. 11-13 adds p-n junctions along the length of the waveguide, in addition to the LDMOS drift regions, and thus provides more sensitivity. A light signal is shown in FIGS. 12 and 13 as a circle in regions 505 and 510.

As described herein and with reference to FIGS. 2-13, an exemplary implementation of the invention includes a device comprising an optical modulator 310 integrated with high voltage LDMOS devices 190a, 190b. The device comprises: a substrate 110; a buried insulator layer 115 deposited on the substrate 110; and a first silicon layer 120 formed on the buried insulator layer 115, wherein the first silicon layer 120 is patterned and etched to form a first LDMOS 190a and a second LDMOS 190b, laterally separated a predetermined distance and wherein each of the first LDMOS 190a and the second LDMOS 190b comprises a plurality of angled silicon mesas. The optical modulator comprises a first optical waveguide 320a formed in a center located mesa 141a of the first LDMOS 190a; a second optical waveguide 320b formed in a center located mesa 141b of the second LDMOS 190b; and a shallow trench isolation region (STI) 125 electrically isolating the first LDMOS 190a and the second LDMOS 190b. The optical modulator comprises a second oxide layer 130 blanket deposited over the patterned and etched first silicon layer 120; a first polysilicon gate structure 180a formed on an outboard mesa 140a of the first LDMOS 190a; and a second polysilicon gate structure 180b formed on an outboard mesa 140b of the second LDMOS 190b. The optical modulator comprises a first contact stud 210a formed on the outboard mesa 140a of the first LDMOS 190a, the first contact stud 210a beside the first polysilicon gate structure 180a; a second contact stud 210b formed on the outboard mesa 140b of the second LDMOS 190b, the second contact stud 210b beside the second polysilicon gate structure 180b; a third contact stud 212a formed on an inboard mesa 142a of the first LDMOS 190a; a fourth contact stud 212b formed on an inboard mesa 142b of the second LDMOS 190b; a fifth contact stud 211a formed on the first polysilicon gate structure 180a; a sixth contact stud 211b formed on the second polysilicon gate structure 180b; and a third oxide layer 200 between and around the first through sixth contact studs.

In embodiments, the optical modulator is a traveling wave modulator. The device may be structured such that the LDMOS devices include a substrate field plate. The device may be structured such that the LDMOS devices are NFET or PFET. The device may be structured such that LDMOS devices have an additional field plate. The device may be structured as a superjunction device.

Figure 14:
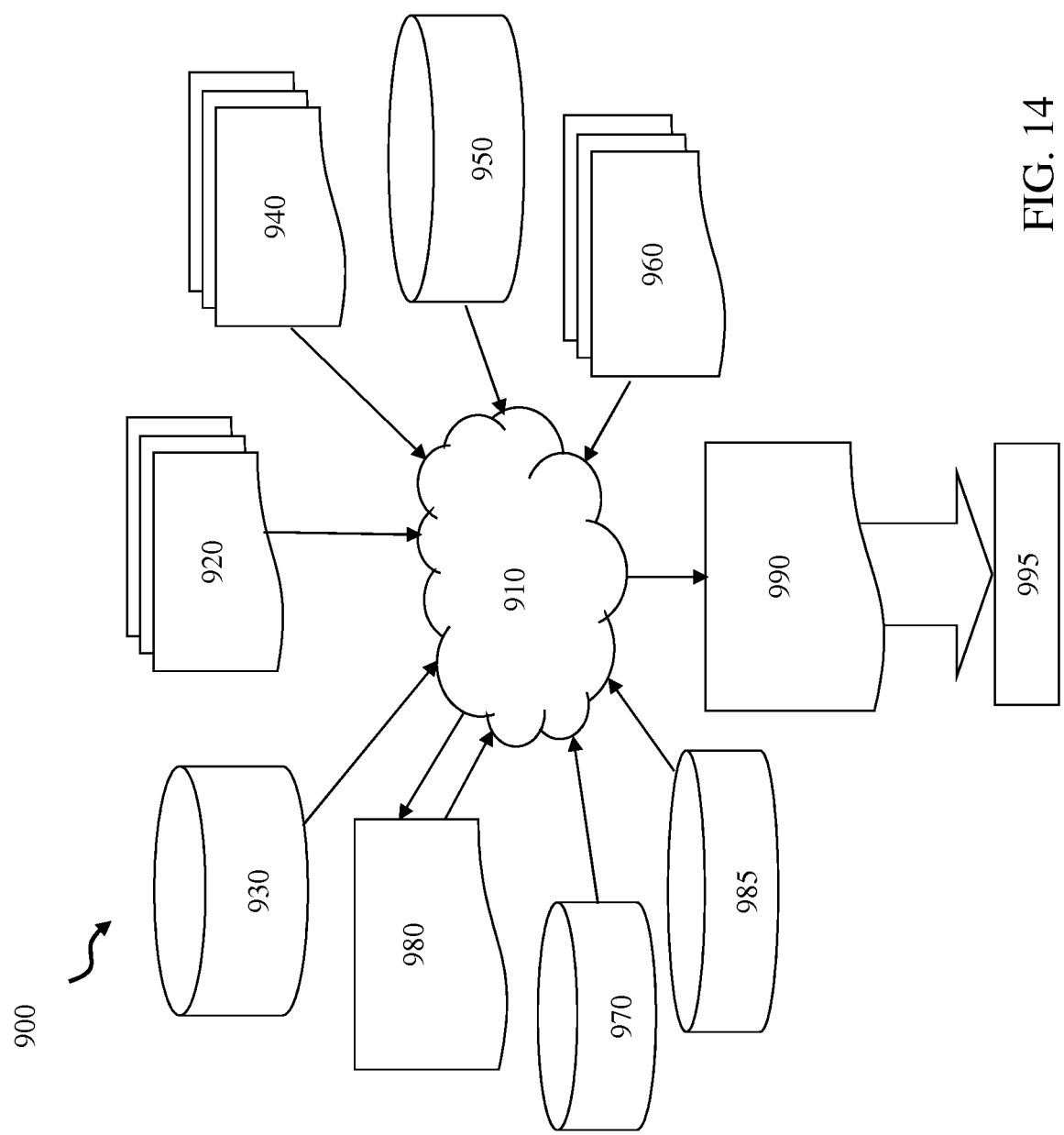
FIG. 14 is a flow diagram of a design process used in semiconductor design, manufacture, and/or test.

FIG. 14 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-13. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-13. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-13 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-13. In one embodiment, design structure 990 may comprise a compiled, executable HDL simulation model that functionally simulates the devices shown in FIGS. 3-13.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-13. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a laterally diffused metal-oxide-semiconductor (LDMOS) device integrated with an optical modulator, wherein an optical waveguide of the optical modulator comprises a silicon-containing structure in a drift region of the LDMOS device, and wherein:
the LDMOS device is arranged in a plurality of silicon mesas; and
the optical modulator comprising the silicon-containing structure in the drift region comprises one of the plurality of silicon mesas.

2. The device of claim 1, wherein the LDMOS device comprises:
a drain region abutting the drift region;
a well region abutting the drift region; and
a source region abutting the well region.

3. The device of claim 2, wherein:
the well region is between the source region and the drift region; and
the drift region is between the well region and the drain region.

4. The device of claim 2, wherein:
the source region and the drain region are heavily doped with a first type of impurity;
the drift region is lightly doped with the first type of impurity; and
the well region is lightly doped with a second type of impurity different than the first type of impurity.

5. The device of claim 1, wherein the LDMOS device comprises a super-junction LDMOS device.

6. The device of claim 1, wherein the optical modulator comprises a travelling wave modulator.

7. The device of claim 1, wherein the optical modulator comprises:
a first optical waveguide;
a second optical waveguide;
a first optical waveguide leg extending between the first optical waveguide and the second optical waveguide; and
a second optical waveguide leg extending between the first optical waveguide and the second optical waveguide.

8. The device of claim 7, wherein:
the drift region of the LDMOS device is in the first optical waveguide leg; and
a second drift region of a second LDMOS device is in the second optical waveguide leg.

9. The device of claim 1, wherein the LDMOS is structured and arranged to induce a phase shift in a light signal transmitted in the optical waveguide of the optical modulator.

10. The device of claim 1, wherein:
the plurality of silicon mesas comprises first, second, and third silicon mesas;
the first silicon mesa and the third silicon mesa are connected by a first strip of silicon material having a height less than that of the first silicon mesa and the third silicon mesa; and
the second silicon mesa and the third silicon mesa are connected by a second strip of silicon material having a height less than that of the second silicon mesa and the third silicon mesa.

11. A device, comprising:
a laterally diffused metal-oxide-semiconductor (LDMOS) device integrated with an optical modulator, wherein an optical waveguide of the optical modulator comprises a silicon-containing structure in a drift region of the LDMOS device, and wherein:
the LDMOS device comprises:
a drain region abutting the drift region;
a well region abutting the drift region; and
a source region abutting the well region;
the source region, the well region, and a portion of the drift region are in a first silicon mesa;
the drain region is in a second silicon mesa; and
the optical modulator comprising the silicon-containing structure in the drift region comprises a third silicon mesa between the first silicon mesa and the second silicon mesa.

12. The device of claim 11, wherein:
the first silicon mesa and the third silicon mesa are connected by a first strip of silicon material having a height less than that of the first silicon mesa and the third silicon mesa; and the second silicon mesa and the third silicon mesa are connected by a second strip of silicon material having a height less than that of the second silicon mesa and the third silicon mesa.

13. The device of claim 11, wherein the first silicon mesa, the second silicon mesa, and the third silicon mesa are on a buried insulator layer that is on a substrate.

14. The device of claim 11, further comprising:
a gate on a portion of the first silicon mesa;
a first electrical contact on and contacting the source region in the first silicon mesa;
a second electrical contact on and contacting the drain region in the second silicon mesa; and
a third electrical contact on and contacting the gate.

15. The device of claim 14, further comprising:
an insulator layer around and between the first electrical contact, the second electrical contact, and the third electrical contact; and
a field plate on a portion of the insulator layer and over a portion of the LDMOS device.

16. An optical modulator integrated with high voltage LDMOS devices, comprising:
a substrate;
a first insulator layer on the substrate;
a silicon layer on the first insulator layer, wherein the silicon layer is patterned into a first LDMOS and a second LDMOS that are laterally separated;
a first optical waveguide in a center silicon mesa of the first LDMOS;
a second optical waveguide in a center silicon mesa of the second LDMOS;
a shallow trench isolation region (STI) electrically isolating the first LDMOS and the second LDMOS;
a second insulator layer over and contacting portions of the silicon layer;
a first polysilicon gate structure on an outboard mesa of the first LDMOS;
a second polysilicon gate structure on an outboard mesa of the second LDMOS;
a first contact stud on the outboard mesa of the first LDMOS and beside the first polysilicon gate structure;
a second contact stud on the outboard mesa of the second LDMOS and beside the second polysilicon gate structure;
a third contact stud on an inboard mesa of the first LDMOS;
a fourth contact stud on an inboard mesa of the second LDMOS;
a fifth contact stud on the first polysilicon gate structure;
a sixth contact stud on the second polysilicon gate structure; and
a third insulator layer between and around the first, second, third, fourth, fifth, and sixth contact studs.

* * * * *